United States Patent
Balster et al.

(10) Patent No.: US 8,012,842 B2
(45) Date of Patent: Sep. 6, 2011

(54) METHOD FOR FABRICATING ISOLATED INTEGRATED SEMICONDUCTOR STRUCTURES

(75) Inventors: Scott Balster, Dallas, TX (US); Badih El-Kareh, Cedar Park, TX (US); Hiroshi Yasuda, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/137,817

(22) Filed: Jun. 12, 2008

(65) Prior Publication Data
US 2009/0127630 A1    May 21, 2009

(30) Foreign Application Priority Data
Nov. 15, 2007 (DE) .......... 10 2007 056 103

(51) Int. Cl.
*H01L 21/331* (2006.01)

(52) U.S. Cl. . 438/353; 438/354; 257/338; 257/E27.015; 257/E21.356

(58) Field of Classification Search .......... 257/511, 257/500, 502, 509, 525, 544, 547–550, 557, 257/558, 575, 929, E21.356, E21.361, E27.015, 257/E21.334, 338; 438/309–313, 519, 521, 438/522, 526, 527, 529, 530, 531, 542, 546, 438/983, 532, 353, 354
See application file for complete search history.

(56) References Cited

U.S. PATENT DOCUMENTS

| | | | |
|---|---|---|---|
| 5,623,159 A | 4/1997 | Monk et al. | |
| 6,005,283 A | 12/1999 | Kim et al. | |
| 6,586,317 B1 * | 7/2003 | Vashchenko et al. | 438/510 |
| 7,176,548 B2 * | 2/2007 | Williams et al. | 257/500 |
| 2008/0217699 A1 | 9/2008 | Disney et al. | |
| 2008/0237704 A1 * | 10/2008 | Williams et al. | 257/338 |

OTHER PUBLICATIONS

U.S. Appl. No. 11/670,729, "A Semiconductor Device Having a First Bipolar Device and a Second Bipolar Device and Method for Fabrication," Badih El-Kareh et al.

* cited by examiner

*Primary Examiner* — Caridad Everhart
(74) *Attorney, Agent, or Firm* — Rose Alyssa Keagy; Wade J. Brady, III; Frederick J. Telecky, Jr.

(57) ABSTRACT

An integrated semiconductor structure that has first and second bipolar transistor structures. The first bipolar transistor structure has a doped tank region in contact with a doped tank region located underneath a contacting sinker. The second bipolar transistor structure has a doped buried region that is the same dopant type as its doped tank region. A method for fabricating an integrated semiconductor structure in a bulk semiconductor wafer. A first patterned photomask is used to form a doped buried region and a doped tank region within the first bipolar transistor structure. A second patterned photomask is used to form a doped buried region and a doped tank region within the second bipolar transistor, plus a doped buried region and a doped tank region underneath a contacting sinker adjacent to the first bipolar transistor.

9 Claims, 3 Drawing Sheets

METHOD FOR FABRICATING ISOLATED INTEGRATED SEMICONDUCTOR STRUCTURES

CROSS-REFERENCE TO RELATED APPLICATIONS

This application claims the benefit of priority under 35 U.S.C. 119 and 37 C.F.R. 1.55 to the prior-filed foreign application, German Application No. 10 2007 056 103.4, filed Nov. 15, 2007, titled "A Method for Fabricating Isolated Integrated Semiconductor Structures", the entirety of which is hereby incorporated by reference.

BACKGROUND OF THE INVENTION

This invention relates to a method for fabricating an integrated semiconductor structure in a bulk semiconductor wafer.

SUMMARY

The present invention relates to a method for fabricating an integrated semiconductor structure which comprises a first bipolar transistor built on a doped semiconductor substrate, wherein the collector of the first bipolar transistor is of the same dopant type as the doped semiconductor substrate. The present invention further relates to an integrated semiconductor structure which comprises a first bipolar transistor and a second bipolar transistor built on a doped semiconductor substrate, wherein the second bipolar transistor is complementary to the first bipolar transistor.

Due to many advantages associated with silicon on insulator (SOI) substrates (e.g. dielectric isolation, increased packing density, reduced cross-talk noise, latch-up immunity), high performance complementary Bipolar/BiCMOS processes often utilize SOI substrates. However, the increased cost associated with SOI substrates relative to bulk silicon wafers can be prohibitive for cost sensitive applications.

When transferring a SOI process to a bulk silicon process, typically an additional photomasking step is required to junction-isolate the PNP bipolar transistor from the P type substrate. For the junction-isolation a doped region is formed in the substrate; for example, in the case of the P type substrate an N doped region is formed, which is typically called NTANK or Deep NWELL. For cost sensitive applications, the added expense associated with the additional photomasking step for forming the NTANK is undesirable.

The present invention provides a method in which the bipolar transistor is junction-isolated from the substrate without requiring any additional photomasking steps, thus minimizing cost and process complexity.

Specifically, the method according to the present invention is a method for fabricating an integrated semiconductor structure in a bulk semiconductor wafer. The semiconductor structure comprises first and second complementary bipolar transistor structures on a doped semiconductor substrate. The collector of the first bipolar transistor structure is of the same dopant type as the doped semiconductor substrate, and the collector of the second bipolar transistor structure is of the opposite dopant type. The method includes the step of forming a doped buried region underneath the collector of the first transistor structure and a doped tank region of opposite dopant type underneath the buried region in a same first photomasking step. A further step is forming a doped buried region underneath the collector of the second transistor structure and a doped tank region of same dopant type underneath the buried region in a same second photomasking step. Additionally the second masking step is used to form a doped buried region underneath a contacting sinker adjacent to the first transistor structure, and to form beneath the doped buried region a doped tank region of same dopant type which contacts the doped tank region of the first transistor structure. Accordingly, no additional photomasking step is required to form the doped tank region that isolates the first transistor structure from the doped substrate.

The present invention further provides an integrated semiconductor structure with two complementary bipolar transistors that are built on a bulk semiconductor substrate and that are junction-isolated from the semiconductor substrate and that can be fabricated without unreasonably increasing the costs. The integrated semiconductor structure according to the present invention comprises a first bipolar transistor structure and a second complementary bipolar transistor built on a doped semiconductor substrate. The collector of the first bipolar transistor structure is of the same dopant type as the doped semiconductor substrate, and the collector of the second bipolar transistor structure is of the opposite dopant type. A doped buried region is located underneath the collector of the first transistor structure and a doped tank region of opposite dopant type is located underneath the buried region. A doped buried region is located underneath the collector of the second transistor structure and a doped tank region of same dopant type is located underneath the buried region. A contacting sinker is provided adjacent to the first transistor structure. A doped buried region is located underneath the contacting sinker. Underneath the doped buried region a doped tank region of same dopant type is provided which contacts the doped tank region of the first transistor structure.

BRIEF DESCRIPTION OF THE DRAWINGS

Further features and advantages of the invention are read from the following description of a preferred embodiment in accordance with the present invention and with reference to the drawings in which.

DETAILED DESCRIPTION OF THE INVENTION

Figure 1:
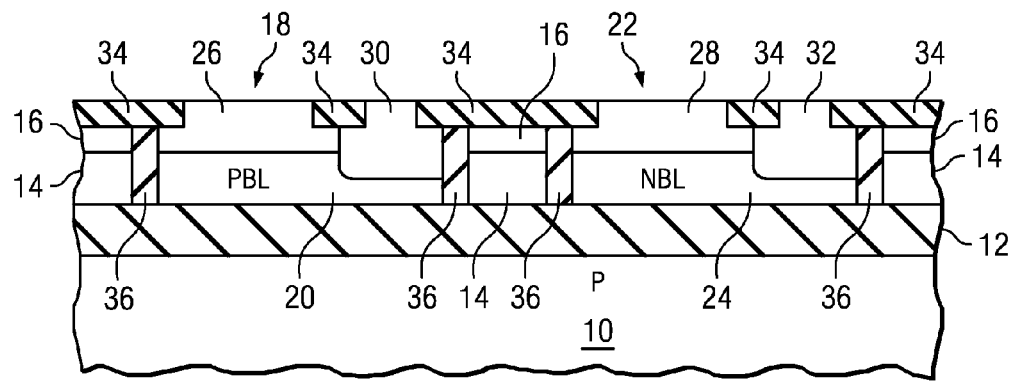
FIG. 1 schematically shows, in a sectional view, a conventional complementary bipolar structure fabricated on a silicon on insulator substrate.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

FIG. 1 shows a conventional complementary bipolar silicon on insulator (SOI) based structure prior to the step of forming a base layer, as is well known from prior art. The complementary bipolar structure is built on a P doped silicon substrate 10 with a buried oxide layer 12. On top of the buried oxide layer 12 a first semiconductor layer 14 and an epitaxial layer 16 are provided. The layers 14 and 16 are typically silicon layers. In the device region of the PNP transistor 18 the layer 14 is heavily doped to form a P doped buried layer 20 (PBL), and in the device region of the NPN transistor 22 the layer 14 is heavily doped to form an N doped buried layer 24 (NBL). The collectors 26, 28 of the bipolar transistors 18, 22 are formed in the epitaxial layer 16 above the PBL 20 and the NBL 24, respectively. In the case of the PNP transistor 18, the collector 26 is P doped, and in the case of the NPN transistor 22, the collector 28 is N doped. The P buried layer 20 makes a low resistance connection of the collector 26 to the device surface via a heavily doped P sinker 30, and the N buried layer 24 makes a low resistance connection to the device surface via a heavily doped N sinker 32. For isolating the NPN transistor 22 and the PNP transistor 18 from each other, shallow trench isolations (STI) 34 and deep trench isolations (DT) 36 are provided. The NPN transistor structure 22 and the PNP transistor structure 18 are isolated from the silicon substrate 10 by means of the buried oxide layer 12.

Processes for fabricating the structure shown in FIG. 1 are well-known from the prior art and shall not be described here in detail. For forming the P doped buried layer 20 and N doped buried layer 24 two separate photomasking and doping steps are required.

Figure 2:
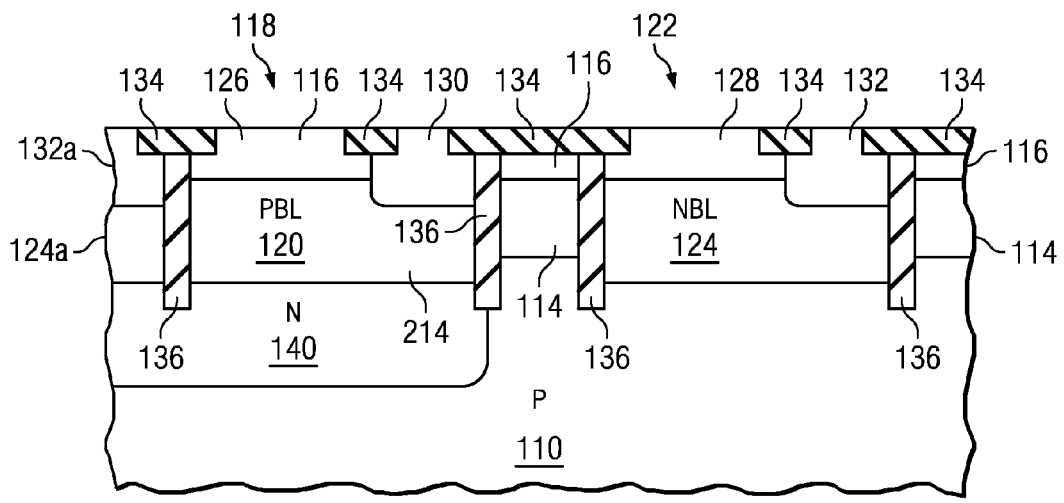
FIG. 2 schematically shows, in a sectional view, a conventional silicon-built bipolar structure with an NTANK.

FIG. 2 shows the complementary bipolar structure from FIG. 1 built on a bulk silicon substrate 110. Since there is no buried oxide layer provided between the P doped substrate 110 and the PNP transistor 118, which isolates the PNP transistor from the P doped substrate, an N doped region 140 is implanted in the bulk silicon substrate 110 for isolating the PNP transistor 118 from the P doped substrate 110 underneath the buried P layer 120. The N doped region 140 is called NTANK. Such an NTANK is typically used in a bulk silicon process, and when transferring a SOI process to a bulk silicon process. A low resistance connection to the NTANK 140 is provided by heavily doped N sinker 132a and NBL layer 124a. The PNP transistor structure 118 is isolated from sinker 132a and NBL layer 124a by a shallow trench isolation (STI) 134 and a deep trench isolation (DT) 136. For forming the NTANK an additional photomasking step is required. Thus, two photomasking steps are required to form the N doped buried layer 124 and the P buried layer 120, respectively, and one additional photomasking step is required to form the NTANK 140. This additional photomasking step leads to undesired additional costs.

Figure 3A:
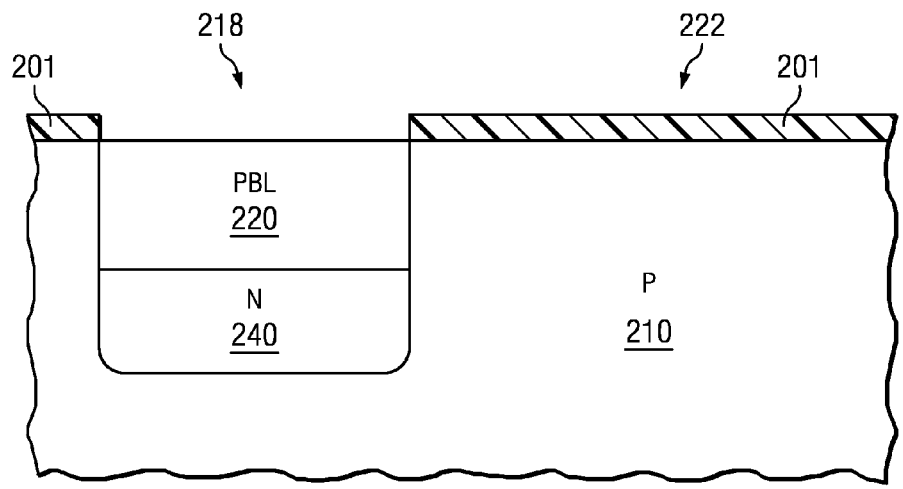
FIGS. 3A-3E schematically shows, in a sectional view, a complementary bipolar structure and fabrication method according to the present invention.
Figure 3B:
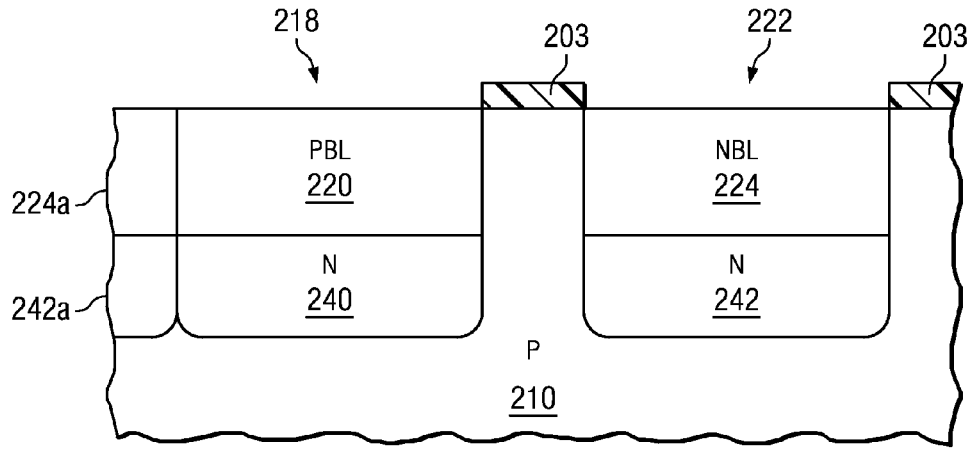

FIGS. 3A-3E show a complementary bipolar structure fabricated according to the preferred method of the present invention. The same reference numbers are used as in FIG. 2, but increased by 100. Referring to FIG. 3A, a first patterned photomask 201 is used to form a P doped buried layer 220 and then it is used again to form NTANK 240 underneath the P doped buried layer 220 (within bulk silicon substrate 210). A second patterned photomask 203, shown in FIG. 3B, is used to form N doped buried layer 224/224a and then it is use again to form NTANK 242/242a underneath the N doped buried layer 224/224a. Standard manufacturing processes are then used to from the isolation structures 234/236, the contacting sinker 232a, the P doped collector 226 of PNP transistor 218, and the N doped collector of NPN transistor structure 222.

Like the PNP transistor structure from FIG. 2, the PNP transistor structure 218 is isolated from the P type substrate 210 by means of an NTANK 240. However, in contrast to the NTANK 140 from FIG. 2, this buried NTANK 240 is implanted through the same mask used for implanting the P doped buried layer 220. Thus, implantation of the P buried layer and the buried NTANK requires only one photomasking step. Of course, the NTANK 240 formed this way is now confined to the region underneath the P doped buried layer (PBL) 220. However, by using a second mask for implanting the N doped buried layer (NBL) 224/224a and also for implanting an NTANK layer 242/242a underneath the n doped buried layer 224/224a, an NTANK region 242/242a is also formed beneath the NBL layer 224/224a. (Note that the n doped buried layer 224a is formed beneath the contacting sinker 232a. Note also that the NTANK region 242a contacts the NTANK 240 of the PNP transistor structure 218.) Accordingly, only two photomasking steps are required to form the PBL/buried NTANK structure (i.e. using a first photomasking step) and the NBL/buried NTANK structure (i.e. using a second photomasking step) of the complementary bipolar transistor structure of FIG. 3C. In this way, the method of the present invention provides a low cost solution for isolating the PNP transistor from the P type substrate without adding a photomasking step compared to the SOI technology. Additionally, the method of the present invention requires one less mask than typically required in bulk silicon processes.

Figure 3C:
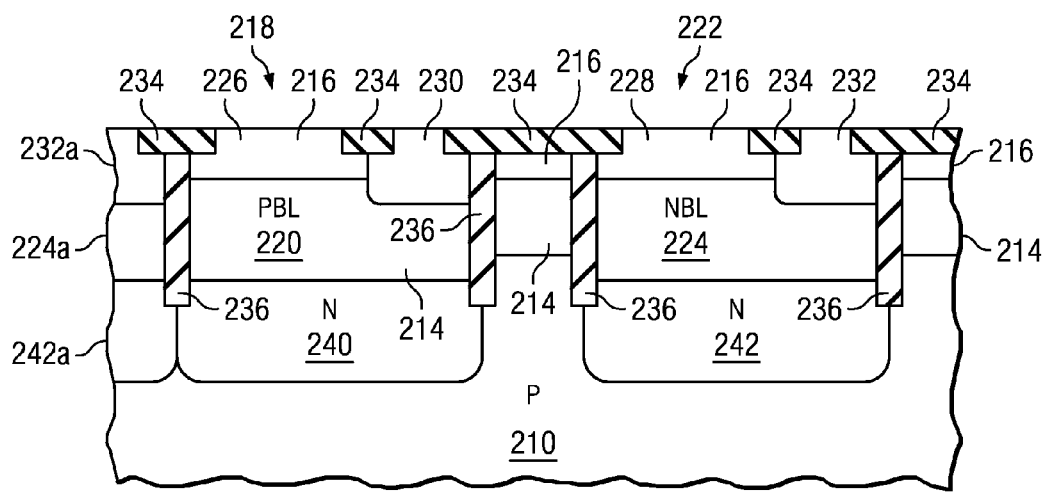
Figure 3D:
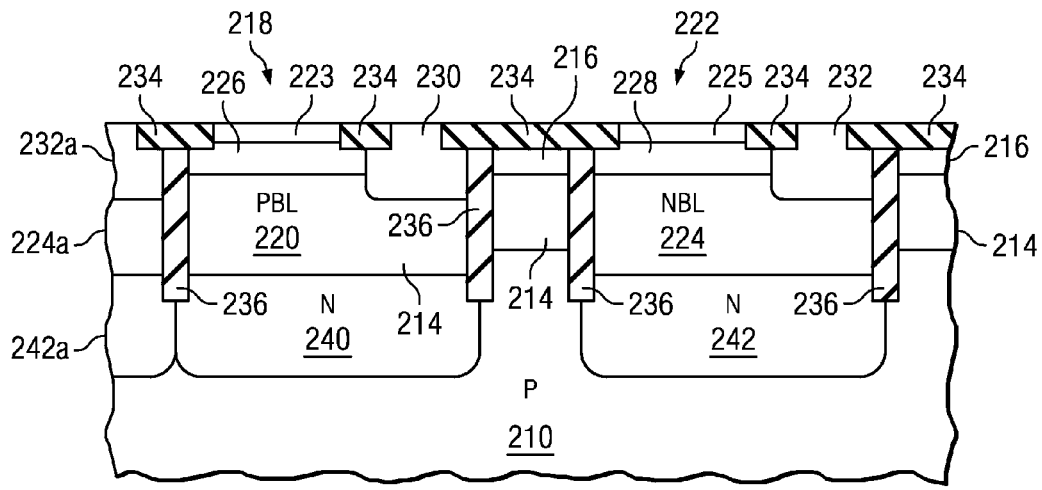
Figure 3E:
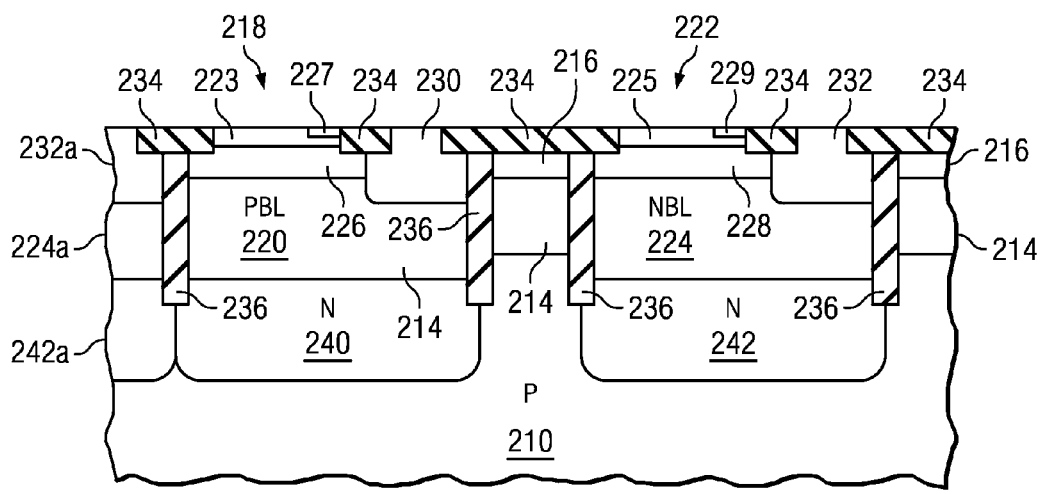

It should be understood that the structure in FIG. 3C, like the structures of FIG. 1 and FIG. 2, is shown prior to the epitaxial step of forming the base structures of the PNP and NPN transistors. Subsequent known manufacturing steps may be used to complete the formation of the PNP transistor structure 218 and NPN transistor structure 222. FIG. 3D shows the bipolar structures after the formation of the base 223 of the PNP transistor structure 218 and the base 225 of NPN transistor 222 according to commonly known manufacturing techniques. FIG. 3E shows the bipolar structures after the formation of the emitter 227 of the PNP transistor structure 218 and the emitter 229 of NPN transistor 222 according to commonly known manufacturing techniques. However, it is within the scope of the invention to change the order of the manufacturing steps shown in FIG. 3A-3E.

It is further noted that, apart from potentially reducing the collector to substrate junction capacitance of the NPN transistor 222, the NTANK layer 242 of the NPN transistor structure 222 has no function. It simply results from the step where the NTANK layer 242a is formed in the same photomasking step which is used for implanting the NBL layer 224/224a.

It should also be clear that in case of an N type substrate the dopant types are all reversed, but the same principles of the invention apply.

In summary, this invention teaches an integrated semiconductor structure and a method for fabricating an integrated semiconductor structure in a bulk semiconductor wafer. The semiconductor structure comprises first and second complementary bipolar transistor structures on a doped semiconductor substrate. The collector of the first bipolar transistor structure is of the same dopant type as the doped semiconductor substrate, and the collector of the second bipolar transistor structure is of the opposite dopant type. The method includes the step of forming a doped buried region underneath the collector of the first transistor structure and a doped tank region of opposite dopant type underneath the buried region in a same first photomasking step. A further step is forming a doped buried region underneath the collector of the second transistor structure and a doped tank region of same dopant type underneath the buried region in a same second photomasking step. Additionally the second masking step to is used to form a doped buried region underneath a contacting sinker adjacent to the first transistor structure, and to form beneath the doped buried region a doped tank region of same dopant type which contacts the doped tank region of the first transistor structure. Accordingly, no additional photomasking step is required to form the doped tank region which isolates the first transistor structure from the doped substrate.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method for fabricating an integrated semiconductor structure in a bulk semiconductor wafer, the method comprising:
    using a first patterned photomask to form in the bulk semiconductor wafer a first doped buried region of a first dopant type underneath a collector of a first bipolar transistor structure plus a first doped tank region of a second dopant type underneath the first doped buried region;
    using a second patterned photomask to form a second doped buried region of the second dopant type underneath a collector of a second bipolar transistor structure plus a second doped tank region of the second dopant type underneath the second doped buried region;
    using the second patterned photomask to also form a third doped buried region of the second dopant type underneath a contacting sinker adjacent to the first bipolar transistor structure plus a third doped tank region of the second dopant type underneath the third doped buried region, the third doped tank region being in contact with the first doped tank region;
    forming a base of the first bipolar transistor coupled to the collector of the first bipolar transistor and a base of the second bipolar transistor coupled to the collector of the second bipolar transistor; and
    forming an emitter of the first bipolar transistor coupled to the base of the first bipolar transistor and an emitter of the second bipolar transistor coupled to the base of the second bipolar transistor.

2. The method of claim 1, wherein all doped regions are formed by an implantation process.

3. The method of claim 1, wherein the integrated semiconductor structure is a BiCMOS device.

4. The method of claim 1, wherein the bulk semiconductor wafer comprises a doped semiconductor substrate, the collector of the first bipolar transistor structure is of the same dopant type as the doped semiconductor substrate, and the collector of the second bipolar transistor structure is of the opposite dopant type as the doped semiconductor substrate.

5. The method of claim 1, wherein the first dopant type is a P dopant type.

6. An integrated semiconductor structure, the integrated semiconductor structure comprising:
    a first bipolar transistor structure having a collector, base, and emitter and a second bipolar transistor structure having a collector, base, and emitter, the first bipolar transistor structure and the second bipolar transistor structure coupled to a semiconductor substrate of a first dopant type, the collector of the first bipolar transistor structure being of the first dopant type and the collector of the second bipolar transistor structure being of a second dopant type;
    a first doped buried region of the first dopant type located underneath the collector of the first bipolar transistor structure and a first doped tank region of the second dopant type located underneath the first doped buried region;
    a second doped buried region of the second dopant type located underneath the collector of the second bipolar transistor structure and a second doped tank region of the second dopant type located underneath the second doped buried region;
    a contacting sinker coupled to the first bipolar transistor structure;
    a third doped buried region of the second dopant type located underneath the contacting sinker; and
    a third doped tank region of the second dopant type located underneath the third doped buried region and contacting the first doped tank region.

7. The integrated semiconductor structure of claim 6, wherein the first dopant type is a P dopant type.

8. The integrated semiconductor structure of claim 6, wherein the integrated semiconductor structure is a BiCMOS device.

9. The integrated semiconductor structure of claim 6, wherein the doped semiconductor substrate is a bulk silicon substrate.

* * * * *